United States Patent [19]

Malm et al.

[11] 4,075,757
[45] Feb. 28, 1978

[54] PROCESS IN THE PRODUCTION OF A MULTILAYER PRINTED BOARD

[75] Inventors: Hans R. Malm; Peter J. Nilsson, both of Perstorp, Sweden; Jiri K. Konicek, Broad Brook, Conn.

[73] Assignee: Perstorp AB, Perstorp, Sweden

[21] Appl. No.: 712,863

[22] Filed: Aug. 9, 1976

[30] Foreign Application Priority Data

Dec. 17, 1975 Sweden .............................. 7514242

[51] Int. Cl.² .......................... H05K 3/06; H05K 3/36
[52] U.S. Cl. .................................... 29/625; 156/656; 156/659; 156/902; 156/151; 156/253; 204/15; 427/96; 427/97
[58] Field of Search ...................... 156/3, 11, 17, 656, 156/659, 902, 151, 253; 204/15; 427/96, 97, 259; 29/625

[56] References Cited

U.S. PATENT DOCUMENTS

| | | | |
|---|---|---|---|
| 3,075,866 | 1/1963 | Balser | 156/11 |
| 3,306,830 | 2/1967 | Bittrich | 204/15 |
| 3,508,330 | 4/1970 | Kubik | 427/97 |
| 3,654,097 | 4/1972 | Degnan | 427/97 |
| 3,901,770 | 8/1975 | Littwin | 204/15 |

FOREIGN PATENT DOCUMENTS

| | | | |
|---|---|---|---|
| 16046/72 | 12/1972 | Sweden. | |
| 1,411,799 | 10/1975 | United Kingdom | 427/96 |

Primary Examiner—Ralph S. Kendall
Attorney, Agent, or Firm—Stevens, Davis, Miller & Mosher

[57] ABSTRACT

In a process for the production of a multilayer printed board built up by starting from a desired number of insulating bases clad on both sides with an unpatterned metal layer, the improvement consisting in that the metal layers, whereout conductive patterns are to be etched and which layers are to be hidden inside the finished multilayer printed board, are coated with a plating resist in the shape of a negative of the desired conductive pattern, that the remaining visible parts of the metal layers, which are to form the conductive patterns, are coated by electroplating with a thin, rough, adhesion-promoting metal layer comprising copper, zinc, nickel, tin or any one of their alloys, that an etch resist layer of nickel, tin or any one of their alloys is electroplated on top of the adhesion-promoting layer, if the latter consists of copper, zinc or any one of their alloys, that the negative plating resist is removed, that the parts of the metal layers thus uncovered are etched away and that the insulating bases provided with conductive patterns are laminated to a multilayer printed board.

7 Claims, 10 Drawing Figures

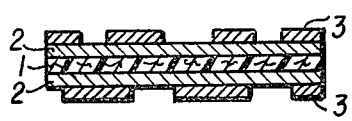 FIG. 1 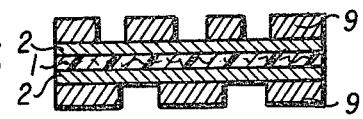 FIG. 6
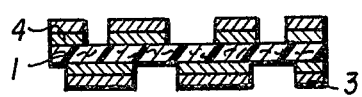 FIG. 2 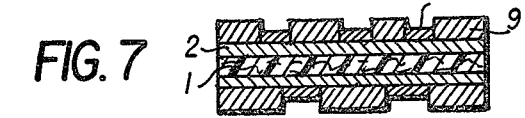 FIG. 7
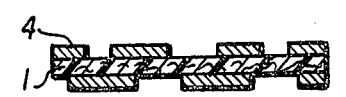 FIG. 3  FIG. 8
 FIG. 4 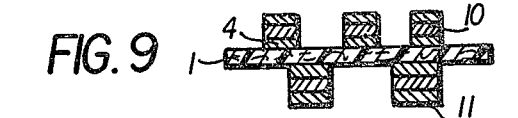 FIG. 9
FIG. 5
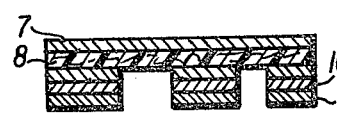
FIG. 10
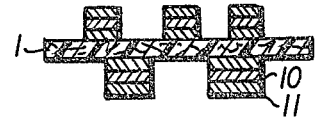
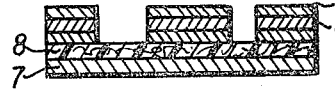

PROCESS IN THE PRODUCTION OF A MULTILAYER PRINTED BOARD

The present invention relates to a process in the production of a multilayer printed board having plated-through holes and intended to be used for electronic purposes.

The multilayer printed boards give good packaging density, short conductor lengths and good reliability. At the same time weight and space are saved. Thus, it is selfevident that multilayer printed boards have come into use to an increasing extent during the last few years when the demand for more compact electronic apparatuses has increased rapidly.

A multilayer printed board is usually built up from a desired number of insulating bases clad on both sides with a thin, unpatterned copper layer, so-called thin laminates. A positive etch resist is applied to the copper layers, which are to be situated hidden copper layers the finished multilayer printed board, whereupon conductor patterns are etched out resulting in so-called inner layers. Plastic layers or layers of a fibre material impregnated with partially cured or hardened plastic (so-called prepregs) are placed between the conductive patterns of the different inner layers. Often the outer layer has not been etched at this stage and consists of an unpatterned copper layer. Then the whole stack is pressed under heat and pressure to a multilayer printed board. Holes in a desired number are made in the multilayer printed board. After a so-called through hole plating the two outermost unpatterned copperlayers are provided with conductive patterns by a process comprising etching, which process is known per se. By the help of the plated-through holes the necessary electrical connection between the different conductor layers is brought about.

Sometimes there is a tendency to delamination between the different layers. Usually the delamination depends on an unsufficient adhesion between the conductive patterns and the applied intermediate plastic material. As mentioned above, the conductive patterns are produced by etching copper layers on insulating bases. Usually, copper foils, which have been made by electroplating, constitute said copper layers. Such foils have one very even surface (drum-side) and another more uneven surface (treatment-side). The uneven surface of the foils is laminated to the insulating base. Thus, the even copper surface on the inner layers will constitute a contact surface towards the applied plastic material at the lamination to a multilayer printed board. Of course, the even copper surface gives a weak adhesion to the applied plastic layer. To improve the adhesion different chemical treatments of the conductive patterns of the inner layers have been used. Black oxidizing of the conductive patterns on the inner layers is one of the methods widely used to increase the adhesion to the plastics. Black oxidizing increases the adhesion but brings about a new problem in the electroless through hole plating. The holes made in the multilayer printed board have to be treated with different chemical solutions for the electroless through hole plating. Some of these chemical solutions influence upon said oxide layer and may dissolve it partially. Then liquid inclusions may occur which have a negative influence upon the temperature resistance at a subsequent soldering step. Therefore, there is a desire to be able to increase the adhesion between the conductive patterns and the applied plastic material and to avoid said difficulties with liquid inclusions at the same time.

According to the present invention we have been able to meet the desire mentioned above and have brought about a process in the production of a multilayer printed board having plated through holes and intended to be used for electronic purposes. The board is built up by starting from a desired number of insulating bases covered on both sides with an unpatterned metal layer comprising copper or a copper alloy. A conductive pattern is etched out in the metal layers, which are to be situated hidden inside the finished multilayer printed board. Plastic layers or layers of a fibre material impregnated with partially cured or hardened plastic (so-called prepregs) are applied between the bases provided with a conductive pattern and said bases are joined to each other to form a multilayer printed board.

The process comprises the following steps:

A. that the metal layers, whereout conductive patterns are to be etched and which layers are to be hidden inside the finished multilayer printed board, are coated with a plating resist layer in the shape of a negative of the desired conductive pattern, B. that the remaining visible parts of the metal layers, which are to form the conductive patterns, are coated by electroplating with a thin, rough, adhesion-promoting metal layer comprising at least one of the metals selected from the group consisting of copper, zinc, nickel and tin or any one of their alloys, C. that an etch resist layer of nickel, tin or any one of their alloys is electroplated on top of the adhesion-promoting layer, if the latter consists of copper, zinc or any one of their alloys, D. that the negative plating resist layer applied in step (A) is removed, E. that the parts of the metal layers uncovered by step (D) are etched away, while the conductive patterns are covered by the etch resistant metal from step (C), F. that at least one layer of plastic or a fibre material impregnated with partially cured or hardened plastic (so-called prepreg) is placed between the insulating bases provided with conductive patterns, G. that the insulating bases provided with the conductive patterns are joined to each other, for example by laminating under heat and pressure, to a multilayer printed board having an extremely good adhesion also between the metal patterns and the plastic layers applied by step F, H. that through holes are made in the multilayer printed board obtained, I. whereupon the holes are plated through and the surface layers on the multilayer printed board obtained are provided with a conductive pattern in a way known per se.

By applying a resist layer in the shape of a negative of the desired conductive pattern according to step (A) above, the great advantage is obtained that an adhesion-promoting metal layer can be applied to the uncovered conductive pattern by electroplating. At that stage no part of the unpatterned metal layers applied to both sides of the insulating base has been etched away. Therefore the whole surface of the insulating base is covered by an electrically conductive metal layer. The etch resist metal layer plated in step (C) gives a good adhesion and at the same time it has a good resistance to chemical attack at the subsequent treatment of the holes in the multilayer printed board.

If the adhesion-promoting layer applied in step (B) consists of nickel, tin or any one of their alloys, step (C) can be excluded. Consequently, in this case the whole adhesion-promoting layer works at the same time as an etch resist.

As mentioned above at previously known processes for the production of multilayer printed boards, as a rule an etch resist in the shape of a positive picture of the desired conductive pattern is applied. Then superfluous metal is etched away, Thereafter only chemical processes can be used if one wants to improve the adhesion of the conductive patterns which have been etched out since the conductors do not have any electrical connection at this stage.

According to the invention the adhesion-promoting metal layer can be applied in step (B) by electroplating in two steps. Then a powder-like or nodulized metal layer can be applied in the first step, which layer is covered in a subsequent electroplating step by one or more stronger metal layers.

Suitably the adhesion-promoting metal layer applied in step (B) should have a thickness of 0.1 to 30 μm, preferably 1 to 5 μm.

The present invention will be elucidated further in detail in connection with the following embodiment examples and the drawing. Example 1 relates to a conventional process for the production of a multilayer printed board and example 2 relates to a process according to the present invention. In the embodiment examples three to six different comparison tests concerning the qualities of the multilayer printed boards produced according to examples 1 and 2 are shown.

In the drawing

FIGS. 1-4 illustrate schematically a production of an inner layer for a multilayer printed board according to a conventional technique comprising the use of a positive resist layer and a black oxidizing of the conductive pattern.

FIG. 5 shows how the different inner layers are stacked together to a press package.

FIGS. 6-9 illustrate schematically a production of an inner layer for a multilayer printed board according to one embodiment of the present invention. Said production comprises the use of a negative plating resist layer and an electroplating of the conductive pattern not covered by resist with a copper layer and then with a nickel layer.

FIG. 10 shows how the different inner layers are stacked together to a press package.

Like numerals of reference indicate like parts in the various Figures, where FIG. 1 shows an insulating base 1 of glass fibre reinforced epoxy resin covered on each side with an unpatterned copper layer 2, which layer 2 are provided with a resist layer 3 in the shape of a positive picture of the desired conductive pattern.

FIG. 2 illustrates a step where the parts of the copper layers 2 not protected by the resist layers 3 have been etched away.

Referring to FIG. 3 the resist layers 3 have been removed from the conductive patterns 4 obtained at the etching step.

In FIG. 4 it is shown that the conductive patterns 4 are provided with a black oxide layer 5. Thus, an inner layer has been produced.

FIG. 5 shows how different inner layers have been stacked together with prepregs 6 to a press package. The prepregs consisted of glass fibre web impregnated with partially cured epoxy resin. The outermost copper layer 7 of each of the two outermost insulating bases 8 had not been provided with a conductive pattern at this stage. The press package was laminated under heat and pressure to a multilayer printed board (not illustrated) which was then provided with holes, whereupon the holes were plated through and the surface layers on the multilayer printed board obtained were provided with a conductive pattern in a way known per se.

FIG. 6 shows an insulating base 1 of glass fibre reinforced epoxy resin covered on each side with an unpatterned copper layer 2, which layers 2 are provided with a plating resist layer 9 in the shape of a negative of the desired conductive pattern.

FIG. 7 illustrates a step where the parts of the copper layers 2 not covered by the negative plating resist layer 9 have been provided by electroplating with a thin, rough, adhesion-promoting copper layer 10.

In FIG. 8 it is shown that the copper layer 10 (the conductive pattern) has been coated by electroplating with a thin etch resistant layer 11 of nickel.

FIG. 9 shows an inner layer obtained when the negative plating resist 9 has been removed and the parts of the copper layer situated between the conductors have been etched away.

Referring to FIG. 10 the different inner layers have been stacked together with prepregs 6 to a press package. The prepregs consisted of glass fibre web impregnated with partially cured epoxy resin. The outermost copper layer 7 of each of the two outermost insulating bases 8 had not been provided with a conductive pattern at this stage. The press package was laminated under heat and pressure to a multilayer printed board (not illustrated) which was then provided with holes, whereupon the holes were plated through and the surface layers on the multilayer printed board obtained were provided with a conductive pattern in a way known per se.

EXAMPLE 1

0.25 mm thick, glass fibre reinforced epoxy laminates, so-called UT laminates, covered on both sides with a 35 μm thick, electroplated copper foil were cleaned carefully by wet grinding, dried in an oven and provided with a resist layer (dry film type) in the shape of a positive picture of the desired conductive pattern. The epoxy laminates were immersed in an etch solution containing 200 g $CuCl_2$ per liter water to etch away the parts of the copper foils which were not covered by the resist. Then the resist layers were removed. The laminates produced in that way were provided with conductive patterns on both sides and they were intended to constitute inner layers in a multilayer printed board. The conductive patterns were cleaned carefully, whereupon they were black oxidized.

Two glass fibre reinforced epoxy laminates covered with copper on both sides and being of the same type as the ones described above were provided with a conductive pattern on only one side according to the method described before. The whole copper surface on the opposite side of the laminate was protected by an etch resist layer during the etching. The resist layer, on top of the conductive pattern which had been etched out, was removed, whereupon the conductive pattern was cleaned and black oxidized. The two laminates having a conductive pattern on only one side were intended to constitute the external layers of a multilayer printed board.

The inner layers were stacked together with prepregs to a press package. The prepreg layers consisted of glass fibre web impregnated with partially cured (B-staged) epoxy resin. Two sheets of prepreg were put between each couple of adjacent inner layers. Two sheets of prepreg were put on top of respectively below the two outermost inner layers. Thereafter the two external layers were placed in such a way that the unpatterned metal layer was directed towards the outside of the press package. The above press package was pressed for 30 minutes at 165° C to a multilayer printed board. The pressure in the press was 20 kg/cm².

After the pressing, the holes necessary for the electrical connection between the different layers were drilled. The unpatterned copper surfaces of the two external layers and the walls of the holes were coated by electroless plating with a 2–3 μm thick copper layer, so-called through hole plating. The copper layers of the external layers were provided with a resist layer in the shape of a negative of the desired conductive pattern. The conductive pattern and the walls of the holes were reinforced by electroplating with a 25 μm thick copper layer. Then the conductive pattern and the walls of the holes were equipped with an electroplated layer of tin and lead. The resist layer was removed, whereupon the multilayer printed board was etched in an alkaline etch solution, which removed the copper situated between the conductors but not the copper conductors with tin and lead.

EXAMPLE 2

0.25 mm thick, glass fibre reinforced epoxy laminates, so-called UT laminates, covered on both sides with a 35 μm thick, electroplated copper foil were cleaned carefully by wet grinding, dried in an oven and provided with a plating resist layer in the shape of a negative of the desired conductive pattern. The visible conductive patterns were cleaned and provided with a copper layer by electroplating for 30 seconds at a current density of 10 A/dm² of the visible conductive pattern in an acid copper solution containing $CuSO_4 . 5 H_2O$: 40 g
$H_2SO_4$: 80 g per liter of water. The electroplating was repeated in the same bath for another 180 seconds at a current density of 3 A/dm² of the visible conductive pattern. The electroplated copper surface had a coarse-grained appearance and a thickness of 3 μm calculated as an average thickness. After a rinse in water the previously electroplated copper layer was coated with a 2 μm thick nickel layer. The nickel layer, which got the corresponding coarse-grained structure as the underlying copper layer, was applied by electroplating for 5 minutes at a current density of 2 A/dm² of the visible conductive pattern in a bath containing Nickel sulfate: 240 g
Nickel chloride: 45 g
Boric acid: 30 g per liter of water. The bath had a temperature of 55° C and a pH amounting to 5.0.

After the nickel plating step the plating resist layer was removed. Then the laminates were etched in an etch solution consisting of a 20 percent by weight solution of ammonium persulfate, which dissolved copper but not the nickel coated conductive pattern. The boards thus produced had a conductive pattern on both sides and they were intended to constitute inner layers in a multilayer printed board.

Two glass fibre reinforced epoxy laminates covered with copper on both sides and being of the same type as the ones described above were provided with a conductive pattern on only one side according to the method described before. The whole copper surface on the opposite side of the laminate was protected by a resist layer during the copper plating steps, the nickel plating step and the etching. The two laminates obtained having a conductive pattern on only one side were intended to constitute external layers in a multilayer printed board.

The inner layers were stacked together with prepregs to a press package. The prepreg layers consisted of glass fibre web impregnated with partially cured epoxy resin. Two sheets of prepreg were put between each couple of adjacent inner layers. Two sheets of prepreg were put on top of respectively below the two outermost inner layers. Thereafter, the two external layers were placed in such a way that the unpatterned metal layer was directed towards the outside of the press package. The above press package was pressed for 30 minutes at 165° C to a multilayer printed board. The pressure in the press was 20 kg/cm².

After the pressing, the holes necessary for the electrical connection between the different layers were drilled. The unpatterned copper surfaces of the two external layers and the walls of the holes were coated by electroless plating with a 2–3 μm thick copper layer, so-called through hole plating. The copper layers of the external layers were provided with a resist layer in the shape of a negative of the desired conductive pattern. The conductive pattern and the walls of the holes were reinforced by electroplating with a 25 μm thick copper layer. Then the conductive pattern and the walls of the holes were equipped with an electroplated layer of tin and lead. The negative resist layer was removed, whereupon the multilayer printed board was etched in an alkaline etch solution, which removed the copper situated between the conductors but not the copper conductors covered with tin and lead.

EXAMPLE 3

One sample having a size of 25 × 25 mm was cut out from each of five multilayer printed boards produced according to example 1. The same number of samples was cut out from five multilayer printed boards manufactured according to example 2. Every sample came from the part of the boards that contained a so-called ground plane in conductor layer 3. The samples were put for 10 seconds on the surface of a melted solder containing tin and lead. The solder had a temperature of 260° C. Then the samples were taken up and left for 3 seconds at room temperature to cool down. The procedure was repeated until a delamination of the sample was obtained. The number of cycles which was necessary to bring about a delamination was noted down. Said value is regarded to be a measure of the adhesion between the different conductor layers. The result is shown in the table below.

Table

| Sample No. | Multilayer printed board produced according to | Number of cycles |
|---|---|---|
| 1 | Example 1 | 4 |
| 2 | Example 1 | 3 |
| 3 | Example 1 | 3 |
| 4 | Example 1 | 4 |
| 5 | Example 1 | 3 |
| 6 | Example 2 | 7 |
| 7 | Example 2 | 7 |

Table-continued

| Sample No. | Multilayer printed board produced according to | Number of cycles |
|---|---|---|
| 8 | Example 2 | 6 |
| 9 | Example 2 | 6 |
| 10 | Example 2 | 6 |

Thus, 3.4 cycles were needed as an average to obtain a delamination of a multilayer printed board produced according to example 1, while the corresponding value for a multilayer printed board produced according to example 2 was 6.4. This means that a considerably better adhesion was obtained at the samples produced according to example 2 compared with the samples produced according to example 1.

EXAMPLE 4

Three multilayer printed boards each containing six layers were produced according to each of examples 1 and 2. The boards were produced according to the standard specification IPC-ML-950A. The boards were kept for 2 hours in an oven at 175° C. When the boards had been cooled down to room temperature they were tested concerning delamination and continuity of the test conductors.

Result
A) A 6-layer printed board produced according to example 1

| Sample No. | Delamination | Continuity |
|---|---|---|
| I | No delamination | Complete continuity |
| II | Delamination in the ground plane | Conduction break in one hole |
| III | " | Complete continuity |

B) A 6-layer printed board produced according to example 2

| Sample No. | Delamination | Continuity |
|---|---|---|
| I | No delamination | Complete continuity |
| II | " | " |
| III | " | " |

EXAMPLE 5

Due to the conduction break observed according to (A) in example 4 micro sections were taken out from the samples. The samples were embedded by casting in plastic, polished and examined in a microscope at a magnification of 200 times. Then it was noticed that the copper oxide layer (obtained at the black oxidizing step) at samples produced according to example 1 had been attacked via the wall of the hole. A pocket had been formed, wherein a chemical solution had probably penetrated. Anything like that could not be observed at samples produced according to example 2.

EXAMPLE 6

A number of tests were made on laboratory scale in order to find out how the adhesion between the glossy side of an electroplated copper foil and sheets of prepreg laminated to said side of the foil varied at different treatments of the glossy copper side before the lamination. Four samples having a size of 150 × 75 mm were cut out from a usual electroplated copper foil having a thickness of 35 μm. The samples were treated in the following way:

Sample No. 1: The glossy side of the foil was cleaned and etched slightly at 20° C for 30 seconds in a 20 percent ammonium persulfate solution. The product obtained corresponded almost to an untreated copper foil and was used for comparison purposes.

Sample No. 2: The glossy side of the copper foil was black oxidized by the help of a known black oxidizing agent called Ebonol C Special. The contents of the said proprietary agent are unknown but probably it contains NaOH and $NaClO_2$. At the black oxidizing, which was carried out during 3 minutes at 100° C, 180 g Ebonol C Special were used per liter solution.

Sample No. 3: First the glossy side of the copper foil was electroplated with copper and then with nickel in the same way as shown in example 2.

Sample No. 4: The glossy side of the copper foil was electroplated with nickel for 2 minutes at a current density of 15 $A/dm^2$ in a plating bath containing
$NiCl_2 . 6 H_2O$: 4 g
$NH_4Cl$: 150 g
per liter of water. The plating was carried out at stirring.

In order to produce four laminates, the foils treated according to the above four methods were laminated to eight sheets of prepreg impregnated with epoxy resin. The prepreg sheets were of the same type as those used according to examples 1 and 2. Then the adhesion of the copper layer on the laminates produced was measured according to the standardized measuring method ASTM D-1867. The following values were obtained:
Sample No. 1: 0.6 lb/in
Sample No. 2: 1.8 lbs/in
Sample No. 3: 8.5 lbs/in
Sample No. 4: 9.0 lbs/in Thus, it is obvious that the treatment according to the invention (samples 3 and 4) gives much better adhesion values than those obtained at an untreated glossy copper surface and a black oxidized copper surface respectively. The nickel layer used according to the invention works as an etch resist too. Furthermore, the nickel layer is virtually not affected by the chemicals which are used for the treatment of the holes of the multilayer printed board produced according to the invention.

The present invention is not limited to the embodiments shown as these can be modified in different ways within the scope of the invention. Thus, at the production of the two external layers of the multilayer printed board it is not necessary to start from an insulating base covered on both sides with copper or a copper alloy. Indeed it is possible to use an insulating base covered with metal on only one side. According to the invention said metal layer is provided with a conductive pattern in the same way as described above. At the pressing of the insulating bases to a multilayer printed board, the conductive pattern of the external layers is directed inwards towards the other insulating bases provided with conductive patterns. Of course, at least one plastic layer and/or a fibre material impregnated with partially cured or hardened plastic (so-called prepreg) is applied also between the conductive pattern of the external layers and the adjacent insulating bases provided with conductive patterns. As the surface layers of the multilayer printed board obtained in said way have no metal coating, the conductive pattern of the surface layers has to be built up at least partly by an additive process comprising electroless plating. Many methods known per se can be used for said purpose.

It is also possible to build up the multilayer printed board from a desired number of insulating bases provided on both sides with a conductive pattern in the same way as described above and two unpatterned metal foils comprising copper or copper alloy, said foils being intended to constitute the external metal layer on each side of the multilayer printed board produced. The insulating bases provided with a conductive pattern on both sides and the two metal foils are laminated to a multilayer printed board in the same way as described above. At least one plastic layer or a fibre material impregnated with partially cured or hardened plastic (so-called prepreg) is applied also between the metal foils and the adjacent insulating bases before the laminating step. After said laminating step, a drilling of the holes and an electroless through-hole plating, the two metal foils of the multilayer printed board produced are provided with a conductive pattern in a way known per se.

Moreover, it is also obvious that the process according to the invention can include further steps than the steps A-I mentioned above. Consequently the latter shall be regarded only as main steps which can be completed in different ways with other steps previously known per se and not being contrary to the inventive idea described above. For example, one or more of the insulating bases covered on both sides with an unpatterned metal layer comprising copper or a copper alloy can be provided with a desired number of plated-through holes (so-called interstitial via-holes) before said metal layers have been provided with conductive patterns in the way described above. Then the different insulating bases provided with conductive patterns are laminated to a multilayer printed board wherein through holes are made, whereupon the holes are plated through and the surface layers on the multilayer printed board obtained are provided with a conductive pattern in a way known per se.

We claim:

1. A process for the production of a multilayer printed board with plated-through holes for electronic use having a desired conductive pattern in each layer with increased adhesion between the layers, comprising:
  a. forming a plating resist layer in the shape of a negative of the desired conductive pattern on the inner surfaces of a desired number of insulating bases having both sides coated with an unpatterned metal layer of copper or a copper alloy to leave remaining visible parts forming the desired conductive pattern,
  b. electroplating said remaining visible parts of the metal coated layers with a thin, rough, adhesion-promoting metal layer comprising at least one metal selected from the group consisting of copper, zinc, nickel, tin, and alloys thereof, and in the event copper, zinc or an alloy thereof is electroplated, then further electroplating on top of this adhesion-promoting layer an etch resist layer of nickel, tin or an alloy thereof,
  c. removing the negative plating resist layer applied in step (a),
  d. etching away the parts of the metal layer uncovered by step (c),
  e. placing between the insulating bases provided with the conductive patterns at least one layer of plastic or a fiber material impregnated with partially cured or hardened plastic to form a composite,
  f. laminating under heat and pressure the composite article of step (e) to form a multilayer printed board having an extremely good adhesion between the metal patterns and the plastic layers,
  g. producing holes in the multilayer printed board in a desired pattern, and
  h. plating through the holes and providing the surface layers on the multilayer printed board with a desired conductive pattern.

2. A process according to claim 1, wherein the adhesion-promoting metal applied in step (b) is nickel, tin or an alloy thereof.

3. A process according to claim 1, wherein the two insulating bases used for each end of the board have only their internal side coated with an unpatterned metal layer of copper or a copper alloy and wherein the surface conductive patterns in step (h) are applied by electroless plating.

4. A process according to claim 1, wherein at least one layer of plastic or a fiber material impregnated with partially cured or hardened plastic is placed above the two insulating bases used for each end of the board and one separate unpatterned foil of copper or copper alloy is placed as a top layer at each end of the board and wherein the surface conductive patterns in step (h) and formed in said foils.

5. A process according to claim 1, wherein the adhesion-promoting metal layer of step (b) has a thickness of 0.1 to 30 $\mu$m.

6. A process according to claim 5, wherein the thickness of the adhesion-promoting metal layer is 1 to 5 $\mu$m.

7. A process according to claim 1, wherein said adhesion-promoting layer is a copper-containing metal layer and wherein an etch resist layer of nickel, tin or one of their alloys is electroplated on top of said adhesion-promoting layer.

* * * * *

UNITED STATES PATENT AND TRADEMARK OFFICE
CERTIFICATE OF CORRECTION

PATENT NO. : 4,075,757
DATED : February 28, 1978
INVENTOR(S) : HANS R. MALM, PETER J. NILSSON and JIRI K. KONICEK It is certified that error appears in the above-identified patent and that said Letters Patent are hereby corrected as shown below:

Column 1, line 20, between "hidden" and "the", delete "copper layers" and insert -- inside --.

Column 5, line 28, between "conductors" and "with", insert -- covered --.

Column 10, line 40, delete "and" and insert -- are --.

Signed and Sealed this

Twenty-seventh Day of June 1978

[SEAL]

Attest:

RUTH C. MASON
Attesting Officer

DONALD W. BANNER
Commissioner of Patents and Trademarks